United States Patent
Hoda et al.

(10) Patent No.: US 7,668,506 B2
(45) Date of Patent: Feb. 23, 2010

(54) RECEIVING APPARATUS AND RECEPTION ANTENNA SETTING METHOD

(75) Inventors: Isao Hoda, Fujisawa (JP); Hitoshi Akiyama, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 622 days.

(21) Appl. No.: 11/285,166

(22) Filed: Nov. 23, 2005

(65) Prior Publication Data

US 2006/0135099 A1   Jun. 22, 2006

(30) Foreign Application Priority Data

Dec. 7, 2004   (JP)   ............................... 2004-353498

(51) Int. Cl.
*H04B 7/14* (2006.01)
*H04Q 7/20* (2006.01)

(52) U.S. Cl. .................... 455/25; 455/562.1; 342/359; 725/72

(58) Field of Classification Search ............ 455/25, 455/562.1; 342/359, 368, 371–372; 343/757–766
See application file for complete search history.

(56) References Cited

U.S. PATENT DOCUMENTS

| | | | | |
|---|---|---|---|---|
| 5,300,935 | A | * | 4/1994 | Yu .............................. 342/359 |
| 6,608,590 | B1 | * | 8/2003 | Naym et al. ................ 342/359 |
| 2003/0189674 | A1 | | 10/2003 | Inoue et al. |

FOREIGN PATENT DOCUMENTS

| | | |
|---|---|---|
| CN | 1394439 A | 1/2003 |
| CN | 1450804 A | 10/2003 |
| JP | 06-113220 | 4/1994 |
| JP | 06-224810 | 8/1994 |
| JP | 07-303218 | 11/1995 |
| JP | 11-252474 | 9/1999 |
| JP | 2001-086019 | 3/2001 |
| JP | 2001-320744 | 11/2001 |
| JP | 2004-165860 | 6/2004 |
| JP | 2004-186722 | 7/2004 |
| WO | WO 01/52534 | 7/2001 |

* cited by examiner

*Primary Examiner*—Lee Nguyen
(74) *Attorney, Agent, or Firm*—Antonelli, Terry, Stout & Kraus, LLP.

(57) ABSTRACT

In a receiving apparatus equipped with a plurality of tuners, if a reception antenna is controlled in such a manner that a reception condition of a channel tuned by one tuner may become suitable, then a reception condition of the channel tuned by another tuner does not always become suitable. The receiving apparatus is provided with an antenna control unit which controls a reception antenna whose reception condition can be set, a first receiving unit, a second receiving unit, and a storage unit which stores thereinto tuning information such as a tuning channel, signal quality information, and a reception antenna setting condition. The receiving apparatus calculates a setting condition of the reception antenna capable of obtaining suitable receiving conditions in both the first and second receiving units by employing tuning information in a first channel and tuning information in a second channel.

12 Claims, 6 Drawing Sheets

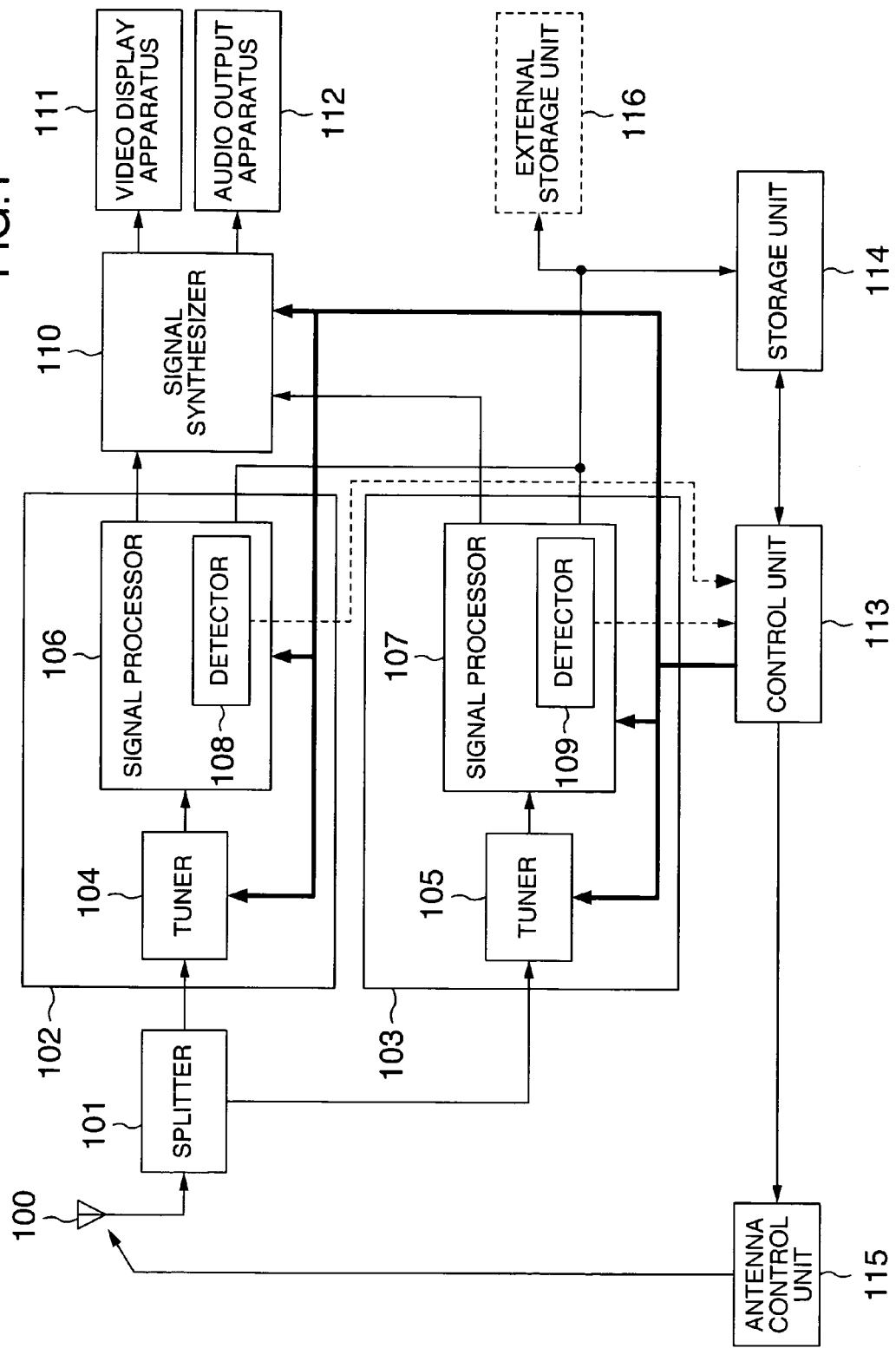

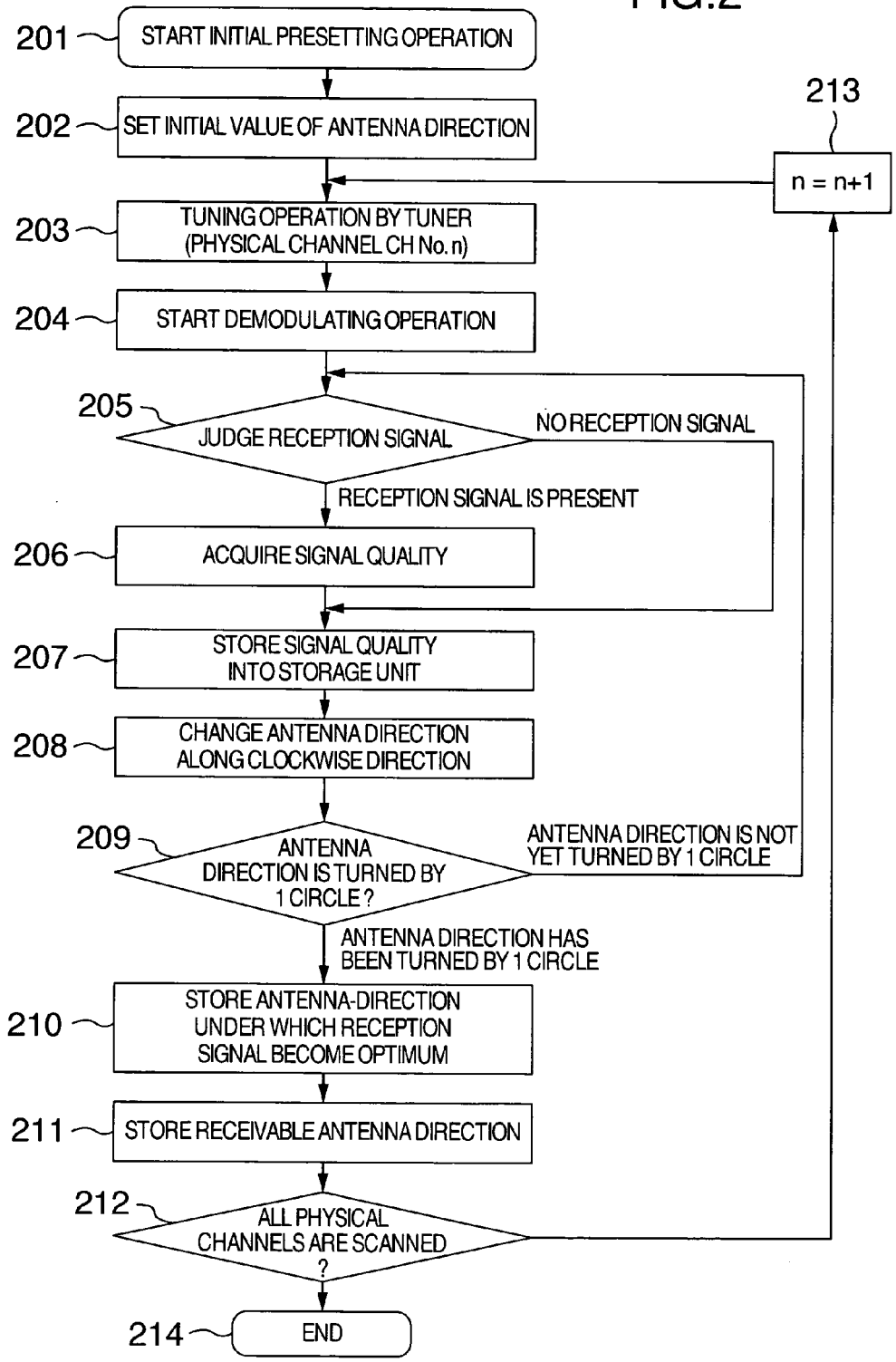

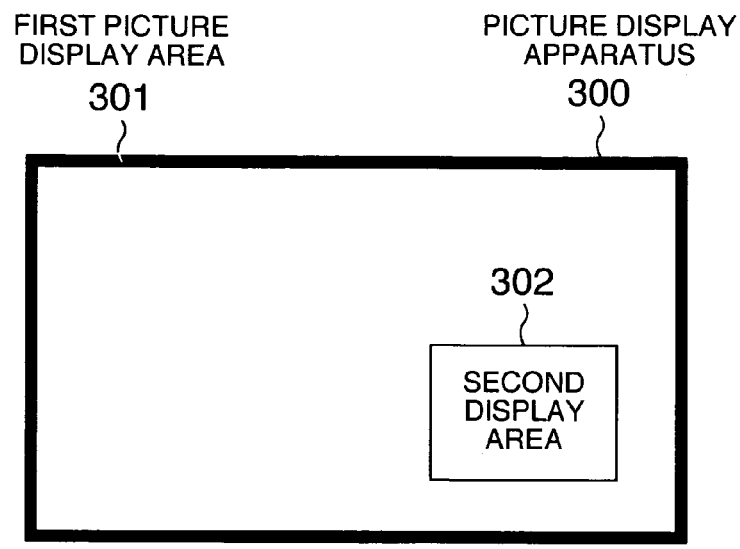
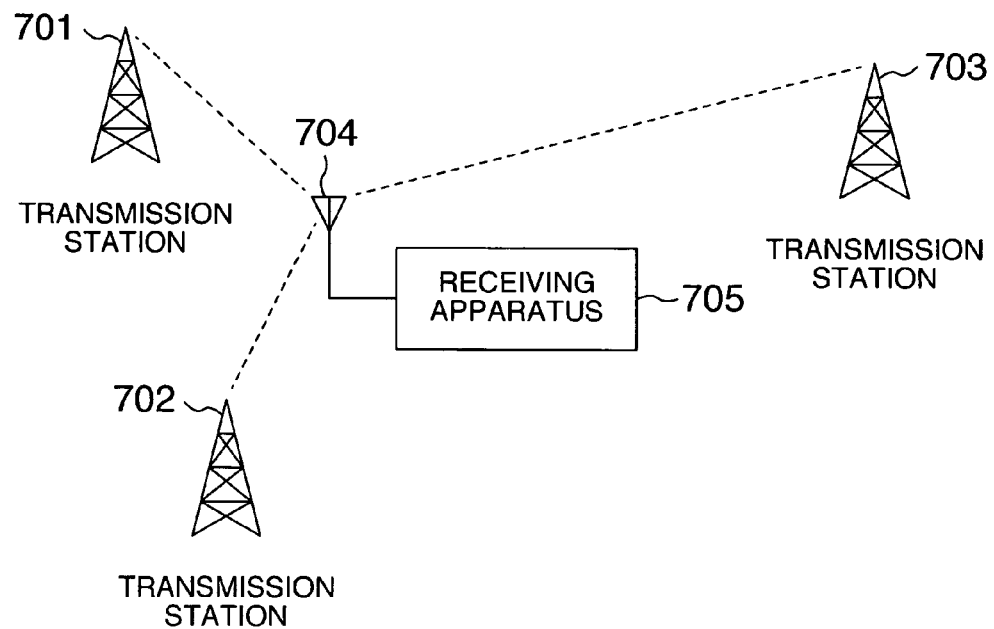

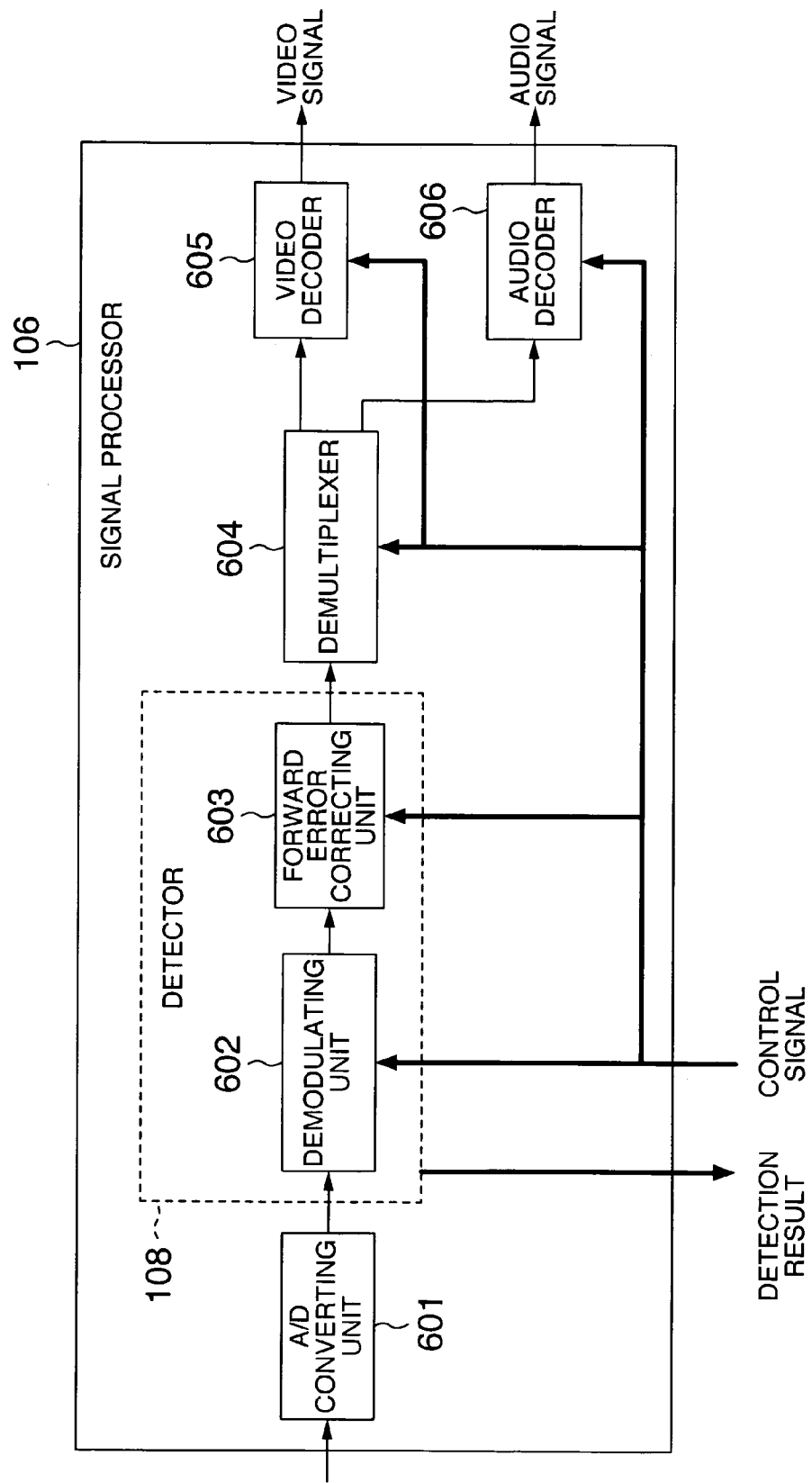

RECEIVING APPARATUS AND RECEPTION ANTENNA SETTING METHOD

INCORPORATION BY REFERENCE

The present application claims priority from Japanese application JP2004-353498 filed on Dec. 7, 2004, the content of which is hereby incorporated by reference into this application.

BACKGROUND OF THE INVENTION

The present invention generally relates to a broadcasting receiving apparatus and a reception antenna direction setting method. More specifically, the present invention is directed to a receiving apparatus and a reception antenna direction setting method, capable of simultaneously receiving a plurality of channels.

There are some cases that a plurality of transmission stations and a plurality of relay stations of broadcasting electromagnetic waves in terrestrial broadcasting systems are present with respect to one reception area. For instance, JP-A-2001-86019 discloses such a technical idea that while optimum setting information of a reception antenna with respect to each of tuning channels has been previously stored, when a tuning operation is carried out, this reception antenna is set based upon the stored setting information.

SUMMARY OF THE INVENTION

In the above-described broadcasting reception apparatus and reception antenna setting method, this broadcasting reception apparatus has been designed only for such a case that one tuner unit is provided with one reception antenna. However, the technical ideas of these broadcasting reception apparatus and reception antenna setting method never consider such a broadcasting reception apparatus equipped with a plurality of tuner units and a plurality of signal processors with respect the one reception antenna. That is, the above-described conventional broadcasting apparatus and receptions antenna setting method never consider such a problem that if a reception antenna is controlled in such a manner that a reception condition of a channel tuned by one tuner may become suitable, then a reception condition of the channel tuned by another tuner does not always become suitable. As a result, even if the reception condition may become better in one tuner, such a case may occur in which reception conditions in tuners other than the first-mentioned tuner may be deteriorated, and thus, superior video signals, better audio signals, superior data, and the like may not be obtained.

The present invention has been made to solve the above-described problems, and therefore, has an object to provide a receiving apparatus, and a reception antenna setting method, capable of realizing suitable reception conditions in the case that a plurality of tuners tune channels which are different from each other, respectively.

To solve the above-explained problems, for instance, a receiving apparatus, according to an aspect of the present invention, is featured by including: an antenna which receives a broadcast signal containing an audio signal and/or a video signal; an antenna control unit which controls the antenna; first and second receiving units which tunes, demodulates, and decodes a desirable channel from the broadcast signal received by the antenna; a signal quality information acquiring unit which acquires information related to qualities of signals tuned by the first and second receiving units; and an antenna setting information storage unit which stores therein setting information related to the antenna based upon the information related to the qualities of the signals acquired by the signal quality information acquiring unit; in which the antenna control unit controls a direction of the antenna by employing the setting information of the antenna stored in the antenna setting information storage unit.

In accordance with the present invention, in the case that a plurality of tuners tune plural channels different from each other respectively, such a receiving apparatus and a reception antenna setting method can be provided by which the respective tuners can realize suitable reception conditions.

Other objects, features and advantages of the invention will become apparent from the following description of the embodiments of the invention taken in conjunction with the accompanying drawings.

BRIEF DESCRIPTION OF THE DRAWINGS

FIG. 1 is a schematic block diagram for indicating a structural example of a broadcast receiving apparatus according to a first embodiment to which the present invention is applied.

FIG. 2 is a flow chart for explaining operations of the broadcast receiving apparatus according to the first embodiment of the present invention, in which an automatic channel scanning operation is carried out so as to acquire setting information of a reception antenna with respective to respective physical channels.

FIG. 3 is a diagram for showing a screen structural example on a picture display apparatus of the broadcast receiving apparatus according to the first embodiment of the present invention.

FIG. 6 is a block diagram for explaining a signal processor in detail, employed in the broadcast receiving apparatus according to a second embodiment of the present invention.

FIG. 7 is a diagram for illustratively showing such a case that a plurality of transmission stations and a plurality of relay stations as to broadcasting electromagnetic waves with respect to one reception area in the first embodiment.

DETAILED DESCRIPTION OF THE EMBODIMENTS

Embodiment 1

Figure 4A:
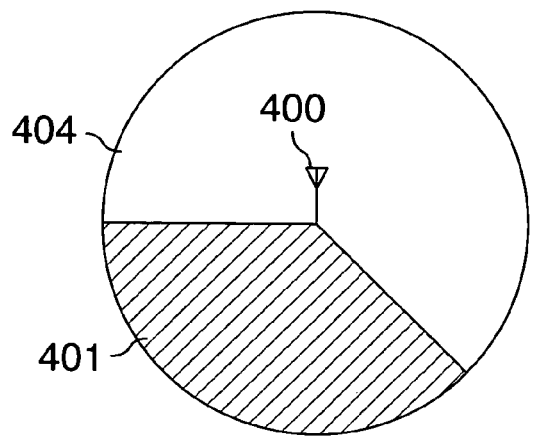
FIG. 4A to FIG. 4C are diagrams for illustratively representing directions of the reception antenna, and for indicating as to whether or not qualities of reception signals which are received by a first reception unit and a second reception unit exceed threshold values in the broadcast receiving apparatus according to the first embodiment of the present invention.

Referring now to drawings, various embodiments of the present invention will be explained. A description is made of a first embodiment of the present invention. FIG. 7 is a diagram for illustratively showing an entire system of the first embodiment. In this system, a broadcast receiving apparatus 705 having a reception antenna 704 receives broadcasting signals transmitted from transmission stations 701, 702, and 703, whose directions and distances are different from each other. In the broadcast receiving apparatus 705, in order to acquire superior video signals, better audio signals, superior data, and the like, the direction of the reception antenna 704 having its directivity is adjusted; an amplification gain (for example, preamplifier gain) is adjusted, and so on.

A detailed description will now be explained. FIG. 1 is a block diagram for showing a structural example of a broadcast receiving apparatus according to the first embodiment. In FIG. 1, a reception antenna 100 alternatively contains a directivity changing unit, the reception sensitivity of which is changed in response to directions of antenna elements. Also, the reception antenna 100 may contain an amplifying unit whose amplification gain (for example, preamplifier gain), a polarity inverting unit capable of inverting a polarity of a reception signal, and the like. These setting information of the reception antenna 100 are controlled by an antenna control unit 115. Also, process operations performed in a tuner 104 and another tuner 105; a signal processor 106 and another signal processor 107; a signal synthesizer 108 and another signal synthesizer 109; and an antenna control unit 115 are controlled by a control unit 113. Broadcasting electromagnetic waves received by the reception antennas 100 are distributed to a splitter 101, the tuner 104, and the tuner 105, respectively.

In the first receiving unit 102, the tuner 104 performs a channel selecting (tuning) process operation for selecting a desirable channel signal from the supplied reception signal, and then, supplies the selected channel signal to the signal processor 106. The signal processor 106 performs a demodulating/signal processing operation responding to the broadcasting system with respect to the supplied reception signal, and then, supplies a video signal, an audio signal and data such as broadcasting program related information to the signal synthesizer 110. A signal processing operation described in this specification corresponds to, for example, a decoding process operation, and the like.

Also, the signal processor 106 contains a detector 108 for detecting information related to a signal quality of a reception signal (will be-referred to as "signal quality information" hereinafter), and this detector 108 notifies the signal quality information of the reception signal to the control unit 113. In the case that a reception signal corresponds to a digital broadcasting signal, this signal quality information assumes an SNR (Signal-to-Noise Ratio) of the reception signal in the demodulating process operation, a bit error ratio in the error correcting process operation, an AGC (Automatic Gain Control) control voltage, and the like. On the other hand, in the case that a reception signal corresponds to an analog broadcasting signal, this signal quality information assumes a reception SNR of a video signal, an AGC control voltage, and the like. It should be noted that the signal quality information in this first embodiment is not limited only to the above-described items.

The second receiving unit 103 performs a similar operation to that of the first receiving unit 102. That is, the tuner 105 performs a channel selecting process operation and then supplies the selected channel signal to-the signal processor 107. The signal processor 107 performs a demodulating/signal processing operation for the received channel signal, and then, supplies a video signal, an audio signal, and data such a broadcasting program related information to the signal synthesizer 110. A detector 109 notifies the signal quality information of the reception signal to the control unit 113.

A control operation executed by the control unit 113 is to store setting information with respect to the tuner 104, setting information with respect to the antenna control unit 115, and the signal quality information supplied from the detector 108 in the storage unit 114 in correspondence with each other. Also, a control operation executed by the control unit 113 is to store setting information with respect to the tuner 105, setting information with respect to the antenna control unit 115, and the signal quality information supplied from the detector 109 in the storage unit 114 in correspondence with each other.

The signal synthesizer 110 selects at least one video signal and at least one data such as program information with respect to the video signals, the audio signals, and the data such as the broadcasting program related information, which are supplied from the signal processor 106 and the signal processor 107, and synthesizes the selected video signal and the selected data with an arbitrary video signal, and then, outputs the synthesized picture/data signal to the picture display apparatus 111, and further, selects at least one audio signal to supply the selected audio signal to the voice output apparatus 112.

In the broadcast receiving apparatus according to this first embodiment, when an initial channel presetting operation is carried out while the antenna 100 is set, when a normal channel selecting operation is performed, and when a channel presetting operation is performed by a user scanning operation, direction setting information of reception antenna elements under which optimum reception conditions are obtained in response to tuned channels have been previously stored in the storage unit 114.

Next, a detailed explanation is made of an initial channel presetting method executed in the first receiving unit 102 with reference to FIG. 2.

FIG. 2 is a flow chart for explaining such operations that an automatic channel scanning operation is carried out as an initial channel presetting function so as to acquire setting information of the reception antenna 100 with respect to the respective physical channels in an embodiment to which the present invention has been applied. Now, a description is made of an example in which the physical channel arrangements defined by the US terrestrial broadcasting system are exemplified.

Firstly, an initial channel presetting operation is carried out in response to an instruction made by a user in a step 201. In a step 202, the control unit 113 controls the antenna control unit 115 in such a manner that the element direction of the reception antenna 100 becomes an initial value.

Next, in a step 203, the control unit 113 sets, for instance, the smallest physical channel, and controls the tuner 104 in such a manner that a desirable physical channel is tuned (selected). In the case of the US terrestrial broadcasting system, since an effective physical channel range is determined from 2 to 69, the physical channel 2 is firstly set.

Next, in a step 204, the control unit 113 controls the signal processor 106 in order to perform such a signal process operation in accordance with the broadcasting system with respect to the reception signal. Then, the initial channel presetting operation is advanced to a step 205 in which the control unit 113 judges a reception condition. In such a case that a desirable signal can be detected, this presetting operation is advanced to a step 206, whereas in such a case that the desirable signal can be detected, the presetting operation is advanced to a step 207. When the presetting operation is advanced to the step 206, the control unit 113 acquires signal quality information of the reception signal from the detector 108.

Next, in the step 207, the control unit 113 stores the selected (tuned) physical channel number, the setting condition of the reception antenna 100, and the signal quality information into the storage unit 115. In the case that the desirable signal cannot be detected in the step 205, the control unit 113 converts the signal quality information into a minimum value, and stores this minimum value into the storage unit 115 in a step 207.

Next, in a step 208, the control unit 113 controls the antenna control unit 115 in such a manner that the element direction of the reception antenna 100 is rotated by a previously defined angle along a clockwise direction, and then, the presetting operation is advanced to a step 209.

In the step 209, the control unit 113 judges as to whether or not the reception antenna 100 has been rotated by 360 degrees. In the case that the reception antenna 100 has not yet been reached to 360 degrees, the presetting operation is returned to the step 205, whereas in the case that the reception antenna 100 has been reached to 360 degrees, the presetting operation is advanced to a step 210.

In the step 210, the control unit 113 stores such a setting information of the reception antenna 100 under which the quality of the reception signal becomes optimum from the signal quality information stored in the storage unit 114 into the storage unit 114, and then, the presetting operation is advanced to a step 211.

In the step 211, the control unit 113 stores into the storage unit 114, such a setting information of the reception antenna 100 in such a case that the reception signal quality exceeds a previously defined threshold value (reference value) from the signal quality information-stored in the storage unit 114, and then the presetting operation is advanced to a step 212. This threshold value (reference value) indicates as to whether or not a broadcasting signal can be received by a user without problem by defining, for example, such a bit error ratio that a final error after error correction has been performed can be regarded as 0.

In a step 212, the control unit 113 judges as to whether or not all of the physical channels which have been defined by the US terrestrial broadband system have been selected. If all of the physical channels have not yet been tuned, then the presetting operation is advanced to a step 212 in which the process loop from the step 208 to the step 212 is repeatedly carried out until all of the physical channels are selected, and thus, the automatic channel scanning operation is ended.

In the case that the broadcasting system corresponding to the first receiving unit 102 is different from a broadcasting system corresponding to the second receiving unit 103, a similar presetting operation may be alternatively carried out in the second receiving unit 103.

A description is made of such an operation when the user selects a broadcasting channel after the above-described initial channel presetting operation has been carried out. In the case that both the video signal and the audio signal are outputted which are received by the first receiving unit 102, the control unit 113 acquires from the storage unit 114, the optimum setting value of the reception antenna 100, which has been acquired in the step 210 of the initial channel presetting operation executed in the first receiving unit 102 based upon the physical channel number to be selected. The control unit 113 notifies this setting value to the antenna control unit 115 so as to control the reception antenna 100 in such a manner that this reception antenna 100 may be directed to the optimum direction in the physical channel to be selected.

Subsequently, a description is made of a method for displaying received pictures of plural channels in the broadcast receiving apparatus according to the first embodiment.

FIG. 3 shows a screen structural example in the picture display apparatus 111 of the broadcast receiving apparatus according to the first embodiment. In this drawing, reference numeral 300 shows a picture display apparatus, reference numeral 301 indicates a first picture display area, and reference numeral 302 represents a second picture display area. For example, the video signal received by the first receiving unit 102 is displayed on the first display area 301, and the video signal received by the second receiving unit 103 is displayed on the second display area 302. Normally, a physical channel tuned by the tuner 102 is different from a physical channel tuned by the tuner 103. It should also be noted that although the screen structure of FIG. 3 is constituted by that the second picture display area 302 is present in the first picture display area 301, the above-described screen structure in this first embodiment is not limited only to that shown in FIG. 3.

As to control operations of the reception antenna 100 in the case that the screen structural example shown in FIG. 3 is realized, concrete operation examples will now be described with reference to FIG. 4A to FIG. 4C.

FIG. 4A is a diagram for indicating as to whether or not both a direction of the reception antenna 100 and a signal quality of a reception signal exceed a threshold value. Reference numeral 400 indicates an antenna, and as previously explained, when the initial antenna presetting operation is carried out, the direction of the antenna 400 is rotated so as to acquire signal quality information. At this time, reference numeral 401 denotes a direction of the reception antenna 100 in such a case that when a physical channel "M" is selected in the first receiving unit 102, a signal quality of a reception signal exceeds the threshold value. Reference numeral 404 shows a direction of the reception antenna 100 in the case that a signal quality does not exceed the threshold value under the same condition.

Figure 4B:
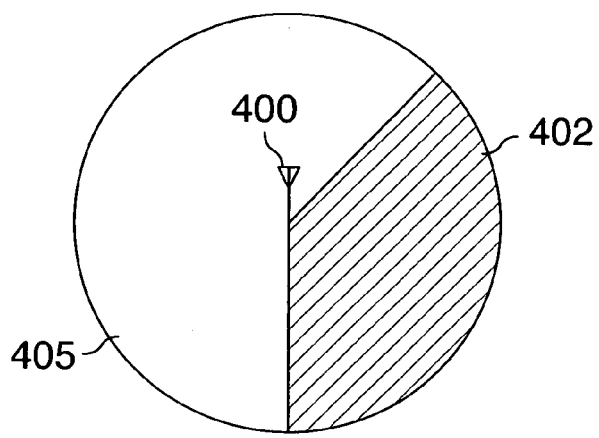

Similarly, reference numeral 402 of FIG. 4B denotes a direction of the reception antenna 100 in such a case that when a physical channel "N" is selected in the second receiving unit 103, a signal quality of a reception signal exceeds the threshold value. Reference numeral 405 shows a direction of the reception antenna 100 in the case that a signal quality does not exceed the threshold value under the same condition.

In such a case that the physical channel "M" is selected by the first receiving unit 102 and the physical channel "N" is selected by the second receiving unit 103, a direction of the reception antenna 100 by which reception qualities of reception signals in both the first receiving unit 102 and the second receiving unit 103 exceed the threshold values may be selected. In other words, such a direction of the reception antenna 100 which can satisfy the references of both the first and second receiving units 102 and 103 may be selected.

Figure 4C:
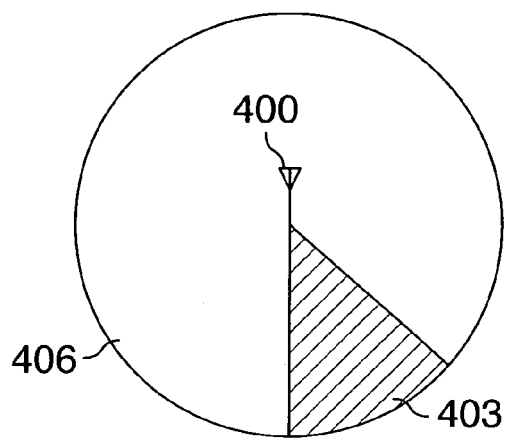

FIG. 4C shows an area 403 which is intersected with the area 401 and the area 402. If the direction of the reception antenna 100 is set to such a range shown in the area 403, then suitable reception conditions can be obtained in both the first receiving unit 102 and the second receiving unit 103.

Figure 5:
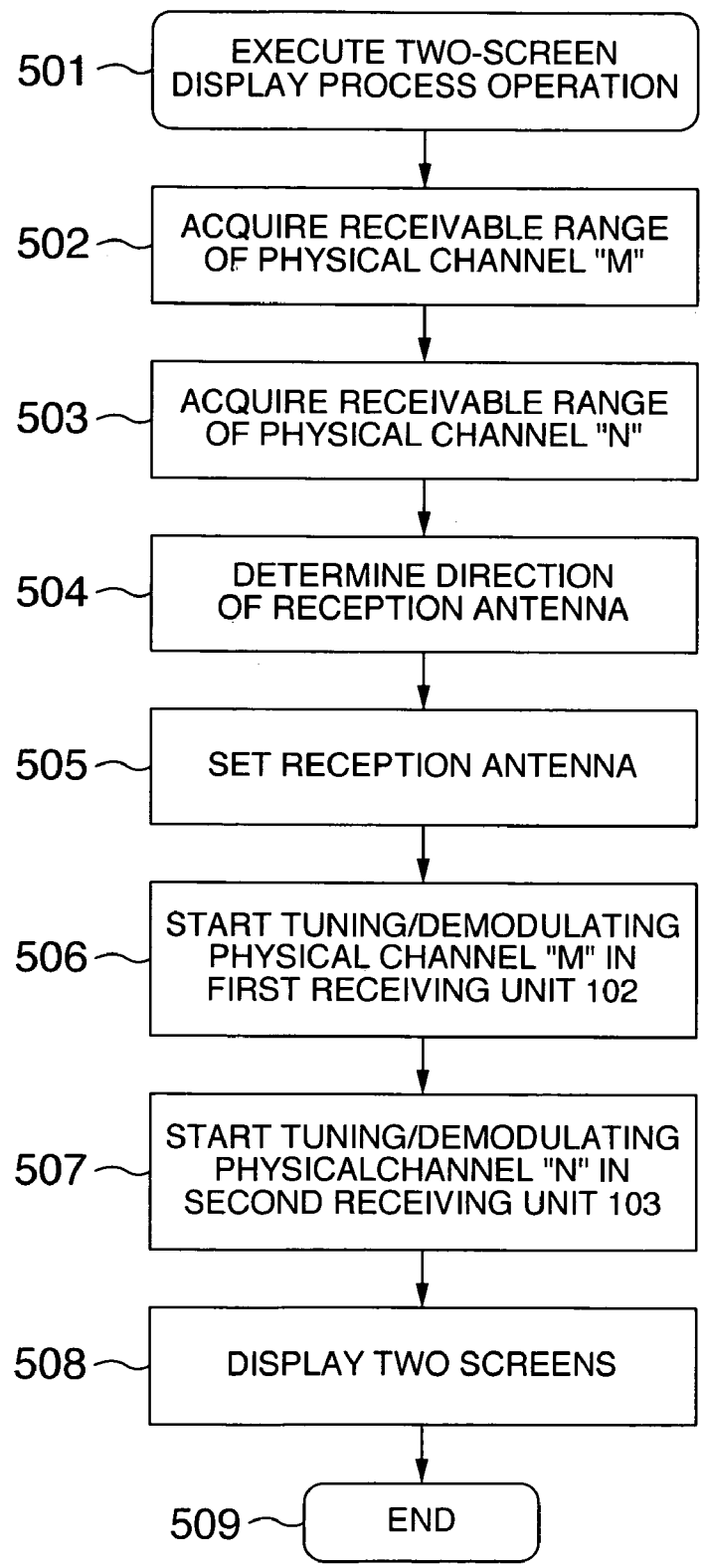
FIG. 5 is a flow chart for explaining a tuning method and a reception antenna setting method in the case that plural screen displays are realized in the broadcast receiving apparatus according to the first embodiment of the present invention.

FIG. 5 is a flow chart for explaining both a tuning (channel selecting) method and a reception antenna setting method in the case that the screen structural example shown in FIG. 3 is realized in the broadcast receiving apparatus according to the first embodiment. It is so assumed that the initial channel presetting operation shown in FIG. 2 has already been carried out.

First, in a step 501, it is so assumed that the user instructs the control unit 113 in such a way that a video signal being transmitted in the physical channel "M" is displayed in the first area 301 shown in FIG. 3, and the same time, a video signal being transmitted in the physical channel "N" is displayed in the second area 302 shown in FIG. 3.

Next, in a step 502, the control unit 113 acquires from the storage unit 114, the receivable setting value of the reception antenna 100, which has been acquired in the step 211 of the initial channel presetting operation executed in the first receiving unit 102 based upon the physical channel "M", and then, the process operation is advanced to a step 503. In this step 503, the control unit 113 acquires from the storage unit 114, the receivable setting value of the reception antenna 100, which has been acquired in the step 211 of the initial channel presetting operation executed in the first receiving unit 103 based upon the physical channel "N", and then, the process operation is advanced to a step 504. In this step 504, the control unit 113 calculates a range where the receivable ranges acquired in the step 502 and the step 503 are intersected with each other, and calculates an optimum value within this calculated range, and then, the process operation is advanced to a step 505. In this step 505, the control unit 113 controls the antenna control unit 115 in such a manner that the direction of the reception antenna 100 is directed to the direction calculated in the previous step 504, and then, the process operation is advanced to a step 506.

In the step 506, the control unit 113 controls the first receiving unit 102 to select the physical channel "M" and perform a demodulating process operation in response to a broadcasting system, and supplies the video signal to the signal synthesizer 110. Next, in the step 507, the control unit 113 controls the second receiving unit 103 to select the physical channel "N" and performs a demodulating process operation in response to a broadcasting system, and supplies the video signal to the signal synthesizer 110.

Next, in a step 508, the control unit 113 controls the signal synthesizer 110 to synthesize the video signals with each other in such a manner that such a screen structure shown in FIG. 2 is made, and then, outputs the synthesized video signal to the picture display unit 111. Then, the process operation is advanced to a step 509 in which this process operation is accomplished.

Since the above-described process operations are carried out, in the case that the broadcast receiving apparatus is equipped with two sets of tuner units and two sets of signal processors with respect to a single reception, the direction of the reception antenna can be set in such a manner that reception conditions of channels tuned by both the two tuner units may become suitable.

Also, as apparent from the foregoing descriptions, even in such a case that a broadcast receiving apparatus equipped with three, or more sets of tuner units and three, or more sets of signal processors, since such a range is calculated in which receivable ranges of physical channels received by the respective tuner units are intersected to each other, the direction of the reception antenna may be set in such a manner that reception conditions of the respective tuner units may become suitable.

Also, in the above-explained first embodiment, since the plural receiving units are provided, the received video signals need not be always displayed. Alternatively, while only the video signal received by the first receiving unit 102 is displayed, the video signal and the audio signal which are received by the second receiving unit 103 may be recorded, or data may be acquired. In this alternative case, the control unit 113 may perform such a control operation that if an input instruction signal inputted by a manipulation by a user, then a video signal and a audio signal which are entered from either the first receiving unit 102 or the second receiving unit 103 are stored in the storage unit 114. As a result, the reception conditions of the channels tuned by both the tuner units may become suitable, and moreover, the video signals under these suitable conditions may be stored, which may achieve a merit for the user.

Further, the broadcast receiving apparatus may be alternatively arranged in such that the video signal and the audio signal outputted from either the first receiving unit 102 or the second receiving unit 103 are stored via the control unit 113 into an external storage unit 116 which is provided outside the broadcast receiving apparatus. An interface used in this alternative case may be constructed of, for example, IEEE 1394 (Institute of Electrical and Electronics Engineers Inc. 1394) and USB (Universal Serial Bus). Since the video signal and the audio signal are stored in the external storage unit 116, this alternative method may contribute a reduction of a storage capacitance of the storage unit 114 provided inside the broadcast receiving apparatus, and also may give such a merit that the video data may be easily carried out by the user.

It should also be understood that such formats that the video signal and the audio signal are stored in the storage unit 114 may be realized by various sorts of formats, for example, a format of an analog signal, a format of a digital signal, or a format of TS (transport stream). However, in this first embodiment, no specific limitation is made as to these formats. Alternatively, the broadcast receiving apparatus may be arranged in such a manner that such a signal which has been demodulating-processed by the signal processor 106 may be directly stored in the storage unit 11, or a signal after being demodulated and decoding-processed may be stored in the storage unit 114.

Embodiment 2

Next, a second embodiment of the present invention will now be described in detail. FIG. 6 is a block diagram for explaining an internal structure of the first signal processor 106 employed in the first embodiment of the present invention in detail.

A reception signal tuned by the tuner 104 is supplied to an A/D converting unit 601, and then, the A/D converting unit 601 converts the supplied reception (analog) signal into a digital signal, and supplies the digital signal to a demodulating unit 602. The demodulating unit 602 performs a demodulating process operation in response to a broadcasting system, and then, supplies the demodulated data to a forward error correcting unit 603.

In the case of the US terrestrial digital broadcasting system, the demodulating unit 602 demodulates such a signal which has been modulated by the 8VSB (8-value Vestigial Side Band) modulation system. In the forward error correcting unit 603, the demodulated data is error-corrected, and thereafter, the error-corrected data is supplied to a demultiplexer 604. The demultiplexer 604 demultiplexes the supplied data, and then, supplies video data to a video decoder 605 and audio data to an audio decoder 606. The video decoder 605 converts the video data into a video signal and supplies this video signal to the signal synthesizer 110, and also, the audio decoder 606 converts the audio data into an audio signal, and then supplies the audio signal to the signal synthesizer 110.

In FIG. 6, the demodulating unit 602 detects an SNR of the reception signal, and then, supplies the detected SNR to the control unit 113 as the reception signal quality information. Also, in the forward error correcting unit 603, a bit error ratio of the demodulated data can be detected, and then, supplies the detected bit error ratio to the control unit 113 as the reception signal quality information. The control unit 113 judges an optimum setting information of the reception antenna 100 based upon at least one of the SNR of the reception signal and the bit error ratio of the demodulated data.

As a consequence, in the case of such a broadcast receiving apparatus equipped with a plurality of tuner units and a plurality of signal processors with respect to one reception antenna, direction setting information of the single reception antenna can be set in such a manner that reception conditions of channels tuned by the plural tuner units can become suitable. It should also be understood that in the receiving apparatus according to this second embodiment, the second signal processor 106 may be alternatively equipped with a similar arrangement to that of the first signal processor, or may be alternatively provided with the second signal processor 106 operable in correspondence with a different broadcasting system.

As apparent from the foregoing description, the present invention is not limited only to the above-explained embodiments, but may be modified without departing from the technical scope and spirit of the invention. Furthermore, the above-described embodiments may involve various sorts of invention, and therefore, various sorts of invention may be extracted by properly combining the plurality of disclosed structural elements with each other. For example, even when several structural elements are deleted from the above-described structural elements disclosed in the embodiments, in such a case that at least one of the above-explained problems may be solved and at least one of the above-explained effects may be achieved, the resulting arrangement from which these several structural elements have been deleted may constitute invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A receiving apparatus comprising:
an antenna which receives a broadcast signal containing an audio signal and/or a video signal;
an antenna control unit which controls said antenna;
first and second receiving units which tunes, demodulates, and decodes a desirable channel from said broadcast signal received by the antenna;
a signal quality information acquiring unit which acquires information related to qualities of signals tuned by said first and second receiving units; and
an antenna setting information storage unit which stores thereinto setting information related to said antenna based upon the information related to the qualities of the signals acquired by said signal quality information acquiring unit; wherein:
said antenna control unit controls a direction of said antenna by employing the setting information of said antenna stored in said antenna setting information storage unit.

2. A receiving apparatus as claimed in claim 1 wherein:
said receiving apparatus is further comprised of:
a synthesizing unit which synthesizes the signals with each other which are tuned, demodulated, and decoded by said first and second receiving units;
a display unit which displays thereon the signal synthesized by said synthesizing unit; and
a control unit which controls that the signal of the channel tuned by said first receiving unit and the signal of the channel tuned by said second receiving unit are displayed on the same screen.

3. A receiving apparatus as claimed in claim 1 wherein:
said receiving apparatus is further comprised of:
a display unit which displays thereon the signals with each other which are tuned, demodulated, and decoded by said first and second receiving units; and a control unit which controls that any one of the signal which is tuned and demodulated by said first receiving unit and the signal which is tuned and demodulated by said second receiving unit is stored into said storage unit, and the other signal is displayed on said display unit.

4. A receiving apparatus as claimed in claim 1 wherein:
said selling information of the antenna contains channel information tuned by said first and second receiving units.

5. A receiving apparatus as claimed in claim 1 wherein:
said antenna control unit controls all, or a portion of a direction indicative of directivity of the antenna, a polarization of the antenna, and an amplification gain of the antenna.

6. A receiving apparatus as claimed in claim 1 wherein:
the information related to the signal qualities acquired by said signal quality information acquiring unit corresponds to a signal-to-noise ratio.

7. A receiving apparatus as claimed in claim 1 wherein: the information related to the signal qualities acquired by said signal quality information acquiring unit corresponds to a bit error ratio.

8. A receiving apparatus as claimed in claim 1 wherein:
the information related to the signal qualities acquired by said signal quality information acquiring unit corresponds to an AGC (automatic gain control) control voltage.

9. A receiving apparatus as claimed in claim 1 wherein:
a demodulating method of said first receiving unit is different from a demodulating method of said second receiving unit.

10. A receiving apparatus comprising:
an antenna control unit for controlling a setting condition of a reception antenna;
a first receiving unit which is capable of acquiring signal quality information indicative of a signal quality of a reception signal by tuning a desirable channel and by demodulating and decoding the signal of said tuned channel;
a second receiving unit which is capable of acquiring signal quality information indicative of a signal quality of a reception signal by tuning a desirable channel and by demodulating and decoding the signal of said tuned channel, independent from the operation of said first receiving unit;
a storage unit which stores thereinto both the signal quality information of the reception signal acquired by said first receiving unit and the signal quality information of the reception signal acquired by said second receiving unit; and
a calculating unit which calculates a setting value of the reception antenna by employing said signal quality information stored in the storage unit.

11. A receiving apparatus as claimed in claim 10 wherein:
said storage unit stores thereinto the information related to the setting conditions of the reception antenna capable of receiving signals under suitable conditions every tuning channel.

12. A receiving apparatus as claimed in claim 10 wherein:
said calculating unit calculates a setting value of the reception antenna, which is suitable for both the channel tuned by said first receiving unit and the channel tuned by said second receiving unit.

* * * * *

UNITED STATES PATENT AND TRADEMARK OFFICE
CERTIFICATE OF CORRECTION

PATENT NO. : 7,668,506 B2 Page 1 of 1
APPLICATION NO. : 11/285166
DATED : February 23, 2010
INVENTOR(S) : Hoda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 844 days.

Signed and Sealed this

Twenty-eighth Day of December, 2010

David J. Kappos
*Director of the United States Patent and Trademark Office*